United States Patent
Chinnadurai et al.

(10) Patent No.: US 9,206,782 B2
(45) Date of Patent: Dec. 8, 2015

(54) ALTERNATOR AND STARTER TESTER WITH ACTIVE LOAD CONTROL

(71) Applicant: Service Solutions U.S. LLC, Warren, MI (US)

(72) Inventors: Manokar Chinnadurai, Owatonna, MN (US); Garret Miller, Owatonna, MN (US)

(73) Assignee: Bosch Automotive Service Solutions Inc., Warren, MI (US)

(*) Notice: Subject to any disclaimer, the term of this patent is extended or adjusted under 35 U.S.C. 154(b) by 55 days.

(21) Appl. No.: 13/826,172

(22) Filed: Mar. 14, 2013

(65) Prior Publication Data

US 2014/0260577 A1 Sep. 18, 2014

(51) Int. Cl.
G01M 15/02 (2006.01)
F02N 11/10 (2006.01)
G01R 31/34 (2006.01)
G01R 31/00 (2006.01)

(52) U.S. Cl.
CPC ............... *F02N 11/108* (2013.01); *G01R 31/34* (2013.01); *G01R 31/007* (2013.01)

(58) Field of Classification Search
CPC .................................................... G01M 15/02
USPC .................................. 73/114.58, 114.59, 114.77
See application file for complete search history.

(56) References Cited

U.S. PATENT DOCUMENTS

| | | | |
|---|---|---|---|
| 7,134,325 B2* | 11/2006 | Krampitz et al. | 73/116.04 |
| 8,209,082 B2* | 6/2012 | Miller et al. | 701/33.3 |
| 8,818,617 B2* | 8/2014 | Miller et al. | 701/33.3 |
| 8,825,272 B1* | 9/2014 | Chinnadurai et al. | 701/29.6 |
| 2006/0090571 A1* | 5/2006 | Krampitz et al. | 73/856 |
| 2007/0095132 A1* | 5/2007 | Krampitz et al. | 73/118.1 |
| 2009/0125179 A1* | 5/2009 | Miller et al. | 701/35 |
| 2013/0325405 A1* | 12/2013 | Miller et al. | 702/183 |
| 2014/0081527 A1* | 3/2014 | Miller et al. | 701/48 |
| 2014/0277827 A1* | 9/2014 | Chinnadurai et al. | 701/1 |
| 2014/0277907 A1* | 9/2014 | Chinnadurai et al. | 701/29.6 |

* cited by examiner

*Primary Examiner* — Eric S McCall
(74) *Attorney, Agent, or Firm* — Baker & Hostetler LLP (57) ABSTRACT

A diagnostic system configured to testing a performance of a vehicle component may include a processor configured to process test information from the vehicle component and control the vehicle component to be tested. The diagnostic system may also include a memory configured to store the test information of the vehicle component and software that operates the vehicle component. The diagnostic system may further include a monitoring module configured to monitor a power supply provided to perform the testing of the vehicle component and cuts off the power supply when the power exceeds a predetermined threshold.

20 Claims, 6 Drawing Sheets

ALTERNATOR AND STARTER TESTER WITH ACTIVE LOAD CONTROL

FIELD OF THE DISCLOSURE

The present disclosure pertains to the field of testing vehicle motor rotary accessory devices. More particularly, the present disclosure relates to apparatuses for testing alternators or starter motors having an active load control circuitry.

BACKGROUND OF THE DISCLOSURE

It is well known in the vehicle industry that certain rotary accessory devices are often used in connection with vehicle motors. Two such accessory devices are alternators and starter motors. Alternators are used in connection with an engine and are typically belt driven by the engine. Alternators have internal components, which when rotated supply electrical power to a vehicle and/or an engine. Alternators are typically removable but rigidly mounted via a bracket to the engine block or the chassis of the vehicle. In many cases, where a standard type of alternator mounting arrangement is used, the alternator has "ears" with holes that are mounted onto a post or bolt attached to the vehicle. This permits pivoting of the alternator so that the alternator can be pivoted around the post against the belt tension in order to install and remove belts, and provide a suitable tension when the belt is installed.

Starter motors are electrical motors, which are typically removable but rigidly mounted to an engine or transmission casing. The starter motor has an electrically driven pinion gear extending from the starter motor that engages a component (typically gears on the flywheel of the engine) in order to be able to rotate the crankshaft of the engine to start it. There is a wide range of attachment mechanisms for attaching the described starter motor.

Conventional alternator and starter tester may test alternators and/or starter motors using a direct current (DC) power source. For example, the DC power source may be used to power the starter motor and bias the alternator during a testing process. The DC power source may determine the capability of an alternator and starter tester. Oftentimes, the alternator and starter tester has limited capabilities because of the available power supply. The maximum rating of the alternator and starter tester is determined by the available power supply and an efficiency of the tested equipment. However, the tested equipment may have different efficiencies or be defective and may lead to tripping of the available power supply protection. Thus, it would be desirable to have an alternator or starter tester with active load control circuitry to monitor an input power level.

SUMMARY OF THE DISCLOSURE

The foregoing needs are met, to a great extent, by the present disclosure, wherein in one aspect, an apparatus is provided that in some embodiments an alternator and starter motor tester includes a power supply monitor.

In accordance with one embodiment of the present disclosure, a diagnostic system configured to testing the performance of a vehicle component is provided. The diagnostic system may include a processor configured to process test information from the vehicle component and control the vehicle component to be tested. Also, the diagnostic system may include a memory configured to store the test information of the vehicle component and software that operates the vehicle component. Further, the diagnostic system may include a monitoring module configured to monitor a power supply provided to perform the testing of the vehicle component, wherein if the monitored power supply exceeds a predetermined threshold, then the monitoring module cuts off the power supply and wherein the memory and the monitoring module are in communication with the processor.

In accordance with another embodiment of the present disclosure, a method of testing a vehicle component is provided. The method may include receiving, via an input device, a selection of the vehicle component for the testing. The method may also include identifying, via an interface module, information associated with the vehicle component. The method may further include monitoring, via a monitoring module, a power supply provided to perform the testing of the vehicle component, determining if the power supply exceeds a predetermined threshold, and terminating connection of the power supply if the power supply was determined to exceed the predetermined threshold.

In still another embodiment, a diagnostic tester configured to test a performance of a vehicle component and includes a processor configured to process test information from the vehicle component and control the vehicle component to be tested, a memory configured to store a database information of the vehicle component and software that operates the vehicle component; a power lead configured to provide a power supply to perform the testing of the vehicle component, and a monitoring module configured to monitor the power supply, wherein if the monitored power supply exceeds a predetermined threshold, then the monitoring module cuts off the power supply using a circuit breaker system in the tester and wherein the memory and the monitoring module are in communication with the processor.

There has thus been outlined, rather broadly, certain embodiments of the disclosure in order that the detailed description herein may be better understood, and in order that the present contribution to the art may be better appreciated. There are, of course, additional embodiments of the present disclosure that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

The present disclosure will now be described with reference to the drawing figures, in which like reference numerals refer to like parts throughout. An embodiment in accordance with the present disclosure provides an alternator and starter motor tester for holding and testing an alternator or starter motor. The alternator and starter motor tester includes a protective hood or cover, a controller connecting an LCD touch-screen, a barcode connector, USB host and USB function connectors, an Ethernet connector, a monitor module, and a flash memory connector.

Figure 1:
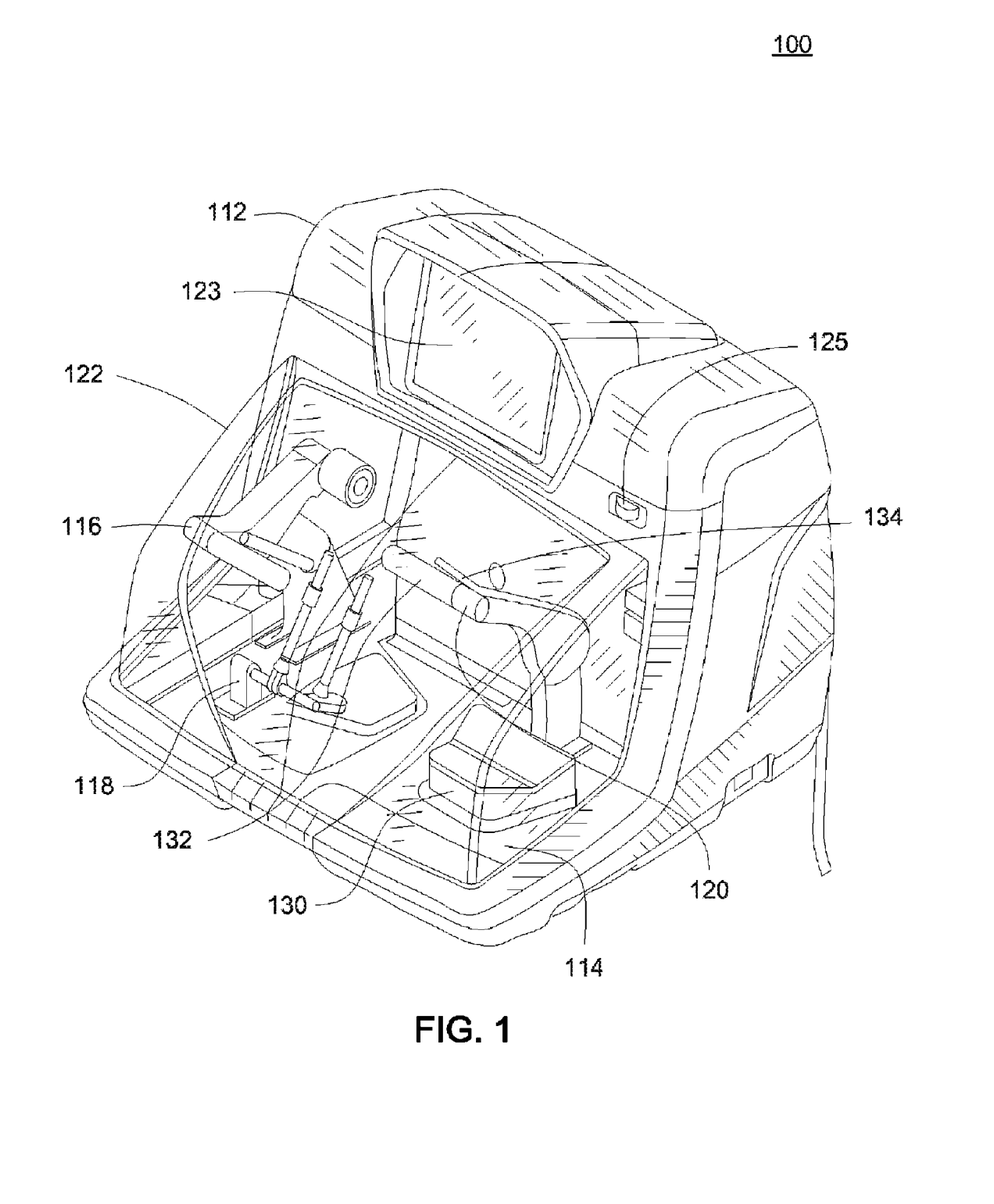
FIG. 1 is a perspective view of an alternator and starter motor tester according to an exemplary embodiment of the present disclosure.

An embodiment of the testing apparatus is illustrated in FIG. 1. FIG. 1 illustrates an alternator and starter motor tester 100 ("tester") including a housing 112 and a base plate (or chassis) 114. The housing 112 surrounds and supports various operative components of the tester 100 including, for example, a power supply, diagnostic electronics, mounting devices, a monitor screen 123, a protective door cover 122, and the like. In one embodiment, the monitor screen 123, e.g., LCD touch-screen may be disposed within the housing 112. A test power button 125, such as a toggle-switch, is provided on the housing 112 to activate and de-activate test power to the drive motor (not shown) and/or the transformer (not shown). A main power switch (not shown) is also used to provide power to the tester 100.

The tester 100 also includes an alternator belt tensioning arrangement generally designated 116, an alternator mounting arrangement generally designated 118, and a starter motor holder arrangement generally designated as 120. Each of the alternator belt tensioning arrangement 116, the alternator mounting arrangement 118, and the starter motor holder arrangement 120 may be mounted directly to the base plate 114.

The alternator belt tensioning arrangement 116 and the alternator mounting arrangement 118 together hold the alternator in place for testing. An installation assembly that includes one or more mounting pins (not shown) can be placed in the alternator mounting arrangement 118 in order to mount the alternator. The alternator can be horizontally or vertically mounted depending on the type of alternator. The pins are replaceable to allow flexibility for current and future applications.

Additionally, a drive belt (not shown), such as a serpentine or V-type belt or the like, can be connected to the alternator and the drive motor to simulate the operating environment in the vehicle. A gas piston may be used for belt tension to ensure consistent belt tension during testing, thereby eliminating over tensioning or belt slippage that may affect test results.

The starter motor holder arrangement 120 includes a quick release ratchet system, wherein the starter is placed on a pad and held in place by the ratchet system. The starter motor holder arrangement 120 includes, a support pad 130, a handle 132 and a release lock 134 that when operated engages and disengages a lock (pawl, for example) from a ratchet (both not shown). The starter motor holder arrangement 120 helps to eliminate the use of straps, and alternatively uses the quick ratchet to hold the starter without the need of any additional holding mechanism or end user assistance during the test. Thus, the aforementioned arrangement makes the loading and unloading of components to be tested much more efficient. The starter motor may be placed on the support pad 130 for testing. Upon the placement, the operator squeezes the release lock 134 and presses down on the handle 132 to engage the starter motor and then releases the lock so that the lock is again reengaged. The starter motor may be powered by a transformer (not shown) in order to simulate operating environments. The transformer may be powered by an external power source and may provide test power to the starter motor via a heavy duty cable and clamps.

FIG. 1 also illustrates the monitor screen 123 that can operate as a touch-screen LCD user interface that communicates with a controller (discussed below) as well as to display information to the end user. The present disclosure also utilizes an on-line tutorial for quickly training new personnel on the unit's functionality and on-line help screens to help new users navigate and test components during a test. The monitor screen 123 may offer step-by-step instructions for setting up the tester 100 and conducting tests. The monitor screen 123 may also display on-screen hook up diagrams and a specification library database, which eliminate the need for paper flipcharts and enables software updates for new alternator applications or starter configurations. This database can be updated by compact flash, flash drive, and other memory media or remotely via a network connection (discussed below). The monitor screen 123 may allow end users to run advertising screens when the tester is not in use. These screens can be uploaded to the tester 100 from an end user's network server or uploaded from a flash drive or other memory media. Additionally, the monitor screen 123 may be capable of displaying information in various updatable languages.

The tester 100 may output "Good/Bad" or "Pass/Fail" results to the end user. An end user printout that details test results and provides technical advice for other potential problems can be provided to the end user.

Figure 2:
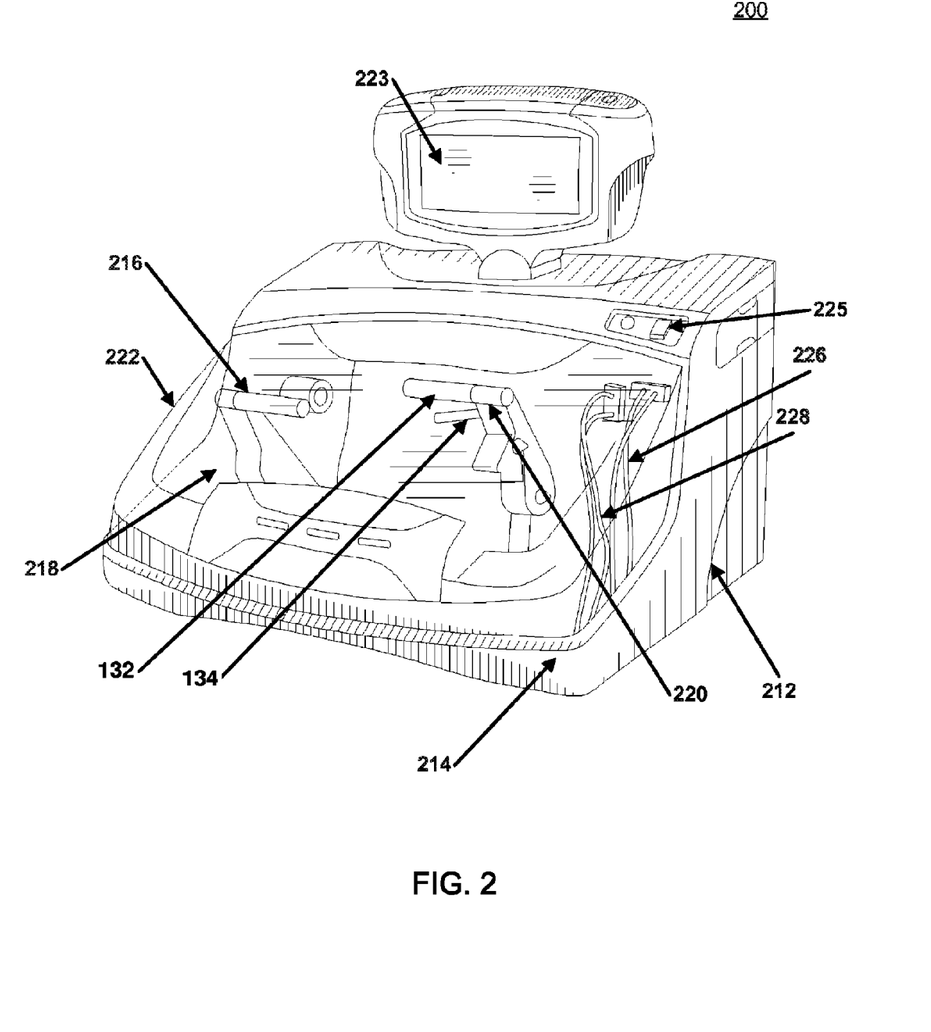
FIG. 2 is a perspective view of the alternator and starter motor tester according to an exemplary embodiment of the present disclosure.

Turning now to FIG. 2, a perspective view of the alternator and starter motor tester 200 according to another exemplary embodiment of the present disclosure is illustrated. The alternator and starter motor tester 200 ("tester") has components similar to the tester 100 depicted in FIG. 1, however it has an alternative design. For example, tester 200 includes a housing 212 and a base plate (or chassis) 214. The housing 212 surrounds and supports various operative components of the tester 200 including, for example, a power supply, diagnostic electronics, mounting devices, a monitor screen 223, a protective door cover 222, and the like. In the embodiment depicted, the monitor screen 223 is an LCD touch-screen disposed within the housing 212. A power button 225, such as a toggle-switch design, is provided on the housing 212 to activate or deactivate test power to the driver motor (not shown) and/or the transformer (not shown). A main power switch (not shown) is also used to provide power to the tester 200.

The tester 200 also includes an alternator belt tensioning arrangement generally designated 216, an alternator mounting arrangement generally designated 218, and a starter motor holder arrangement generally designated as 220. Each of the belt tensioning arrangement 216, the alternator mounting arrangement 218, and the starter motor holder arrangement 220 may be mounted directly to the base plate 214 and include similar components described for FIG. 1 and thus are not repeated.

The test adapters 226 and power leads 228 may be connected to the alternator or starter motor in order to provide test information to tester 200. Power leads 228, including, for example, battery lead, ground lead, solenoid lead and sense lead are connected to the starter motor in order to conduct the tests.

In the embodiment depicted in FIG. 2, the tester 200 may incorporate enhanced safety features, such as the protective door cover 222 to enclose moving parts during tests. The protective door cover 222 conceals the belt tensioning arrangement 216, the alternator mounting arrangement 218, the starter motor holder arrangement 220, and other test components, such as an alternator or starter motor in the closed position.

In the closed position, the protective door cover 222 reduces the likelihood of the possibility of hands getting caught in moving parts or projectiles potentially contacting the end user. The protective door cover 222 may employ a door interlock switch (not shown) to disable tests while the protective door cover 222 is open. Alternatively, the protective door cover 222 may include a viewing window so that the operator can observe the components during the tests.

Figure 3:
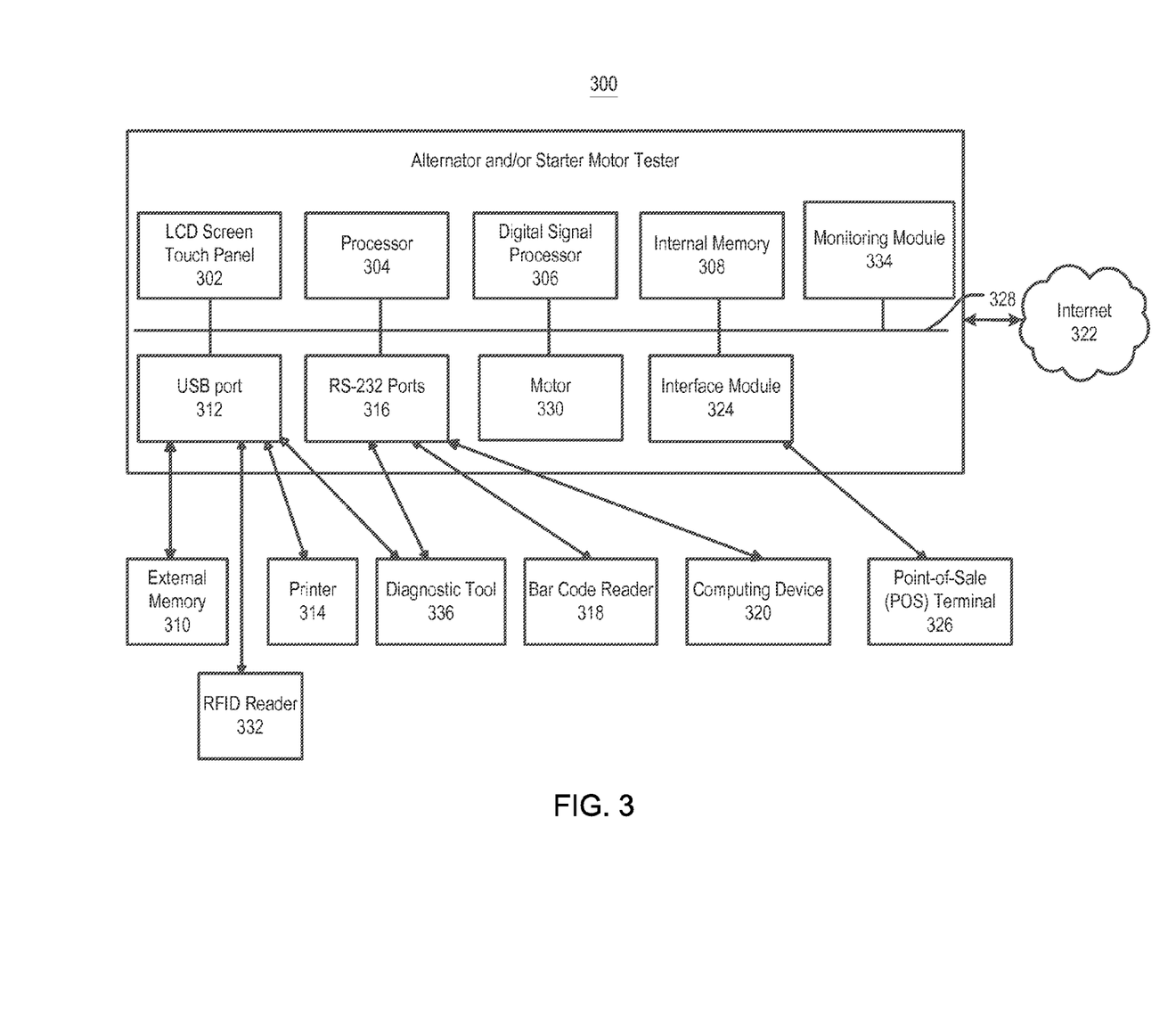
FIG. 3 is a block diagram of the main components of the alternator and starter motor tester according to an exemplary embodiment of the present disclosure.

FIG. 3 is a block diagram 300 of the components of the alternator and starter motor tester as previously described and shown in FIGS. 1-2 according to an exemplary embodiment of the present disclosure. The components generally include a monitor screen, such as LCD screen 302 that may present various information to the user. The LCD screen 302 may be a touch panel to input information as desired by the user and can be controlled by a processor 304. The processor 304 may be any processor or controller, including a FPGA (Field Programmable Gate Array) or application-specific integrated circuit (ASIC). The processor 304 is capable of running various OS (Operating System) including Linux, Apple Computer's Operating System (such as OS X), Windows, Windows CE and the like. The processor 304 communicates with a digital signal processor 306, which includes an analog to digital (A/D) converter. The processor 304 communicates with other components (e.g., internal memory 308, USB port 312, RS-232 ports 316, motor 330, interface module 324 and/or monitoring module 334) of the tester 100 via a communication bus 328.

The processor 304 is configured to communicate with an internal memory 308 and an external memory 310. The internal memory 308 and/or the external memory 310 can be any memory including, for example, compact flash, SD (secure digital), USB flash drives, and the like. A universal serial bus (USB) port 312 communicates with the processor 304 and provides a connection for various USB compatible devices. The USB port 312 may communicate as USB 1.1 or USB 2.0, 3.0 or other data rates. RS-232 ports 316 also communicate with the processor 304 and provide a connection for various external devices. The USB compatible and external devices may include, for example, the external memory 310, a printer 314, a bar code reader 318, a computing device 320, a point-of-sale terminal 326, a radio frequency identification (RFID) reader 332 and/or a diagnostic tool 336.

The RFID reader 332 functions to read identifying information about the tested component containing an RFID chip once it is within a detection range. The RFID chip may be integrated or separated from the tested component. The RFID chip may contain information about the alternator or starter motor such as alternator/starter motor type, serial number, manufacturer, date of production or shipment, place of production or shipment, previous test results, electrical specifications, diagnostic specification, maintenance information, bulletins, serial number, lot number, warranty information, a manufacture data code, method of shipment and the like.

The computing device 320 can be any computing device, including a personal computer, a laptop, a tablet, a personal digital assistant (PDA), a smart phone or the like. In another embodiment, the USB port 312 and RS-232 ports 316 may accommodate a data cable that may connect to a data link connector in a vehicle to retrieve diagnostic information, such as diagnostic trouble codes (DTCs).

Similarly, the diagnostic tool 336 can be any computing device and can provide additional diagnostic information to the tester 100. The additional diagnostic information may include diagnostic trouble codes (DTCs) that are set in a vehicle's electronic control unit. The DTCs can be used as tester as part of its analysis to determine if the issue is with the component under test or another component in the vehicle.

The bar code reader 318 allows the user to scan bar code information that may be attached to the tested component or the VIN (vehicle identification number) of the vehicle from which the tested component came from. The bar code reader 318 may be, for example, a conventional optical bar code reader, such as a gun or wand type reader. The bar code may provide a variety of information regarding the alternator or starter motor to be tested similar to information contained in an RFID.

During operation, the end user swipes or aims the bar code reader 318 over the bar code that is associated with the particular alternator or starter motor to be tested and reads the bar code accordingly. The bar code itself may be affixed to the alternator or starter motor at the time of manufacture, purchase, shipment or service. The bar code may contain information, or point to information stored in a database. The database may be local (e.g., internal memory 308) or remotely (e.g., external memory 310) located and accessible by the Internet, Ethernet, Wi-Fi, LAN, Bluetooth, near field communication, or other wireless or a wired connection. The data provided by the bar code is not limited to the examples given.

In some embodiments, the printer 314 may print bar code labels that may be attached or otherwise associated with the alternator or starter and provides updated information about the component. The updated information may include, among other things, service dates, service procedures (including the results), and warranty information (e.g., time left on warranty, who was the original purchaser, what types of service are and are not warranted, etc.). The printed label may then be read by the bar code reader 318 in subsequent tests. These features can eliminate possible typographical errors during manual input and by speeding up part number selection and entry by having a scanning capability.

The present disclosure also has the ability to store and display or print technical bulletins associated with specific part numbers of components to be tested. Printouts of test results can give rebuilders access to data obtained by users to assist in the further analysis of that component.

The point-of-sale terminal 326 may be used to interact with the user or vehicle owner. At the point-of-sale terminal 326, the user may enter information such as parts number, cost of the component, credit card information, parts inventory, and the like.

The interface module 324 may comprise a database (or access the internal memory 308 or the external memory 310 that stores the database) for storing information associated with the tested components and information associated with the diagnostic test performed by the tester 100. The information associated with the tested components may include, but not limited to, alternator/starter type, serial number, bulletins, manufacturer, date of production or shipment, place of production or shipment, previous test results, electrical specifications, port connections, electrical configuration/layout, diagnostic specification, maintenance information, lot number, warranty information, a manufacture data code, method of shipment and the like. The information associated with the diagnostic test performed by the tester 100 may include, but not limited to, test specification, test values, test results (including previous test results), data, time, employee, location, weather condition before or during testing (extreme cold or heat that may affect the test) and/or any other information associated with the diagnostic test.

The interface module 324 may communicate with external devices coupled to the tester 100 as discussed herein for the (USB) port 312 and RS-232 ports 316.

The interface module 324 may comprise a database (or access the internal memory 308 or the external memory 310 that stores the database) for storing information associated with the tested components and information associated with the diagnostic test performed by the tester 100. The types of information are discussed here in and thus will not be repeated.

The interface module 324 may communicate with a monitoring module 334 that may control an active load of the tester 100 to monitor and detect an input power level. For example, the interface module 324 may provide an electrical specification of the alternator or starter motor to be tested to the monitoring module 334 and the monitoring module 334 may monitor and control an input power level (e.g., input voltage potential and/or input current) based at least in part on the supplied electrical specification. In one embodiment, the monitoring module 334 may set a threshold voltage potential level and/or a threshold current level of the tester 100 before testing of the alternator and/or starter motor, and may control an amount of load that is applied to the alternator to be tested based at least in part on the threshold voltage potential level and threshold current level. If an alternator or starter motor to be tested can only supply a maximum load current of 15 amps or 25 amps, then the monitoring module 334 may monitor the input power level in order to control that the input power level does not exceed a predetermined threshold.

In order to control the input power, the monitoring module 334 may lower or cut off the load applied to the alternator if the input power level exceeds a threshold power level. In another embodiment, the monitoring module 334 may automatically disengage the tested component from the tester 100 or stop the testing cycle if the input power level exceeds a threshold power level. For example, the monitoring module 334 may automatically trip a breaker circuitry (shown in FIG. 6) when the input power level exceeds a predetermined threshold. In another example, the monitoring module 334 may provide an indication (e.g., visual or sound) to a user when the input power level exceeds a predetermined threshold and the user may manually cutoff the input power supply via a switch (shown in FIG. 6) or may manually disengage the tested component from the tester 100.

In one embodiment, the monitoring module 334 may continuously or intermittently monitor and detect an input power level of the tester 100. The monitoring module 334 may also verify whether the proper voltage potential and/or current is supplied to the tested component based at least in part on the information of the alternator or starter motor to be tested.

In another embodiment, during different stages of the test, different loads may be applied to the tested component and thus may require different input power levels to perform the test. The monitoring module 334 may monitor input power level at different stages of the test performed by the tester 100 and at any stage of the diagnostic test, the monitoring module 334 may terminate the test when the input power level exceeds a predetermined threshold. In another exemplary embodiment, the monitoring module 334 may monitor input power level at a first stage of the test to determine either to continue the test to a second stage or terminate the test based at least in part on the input power level during the first stage.

The monitoring module 334 may include galvanic isolated current monitoring circuit and voltage monitoring circuits. For example, galvanic isolated current and voltage monitoring circuits may include capacitive galvanic isolated circuit, inductive galvanic isolated circuit, electromagnetic galvanic isolated circuit, optical galvanic isolated circuit, acoustic galvanic isolated circuit, mechanical galvanic isolated circuit and other types of galvanic isolated circuits. The monitoring module 334 may be coupled to the input power circuitry of the tester 100 to monitor an input power of the tester 100. For example, the input power circuitry of the tester 100 and the monitoring module 334 may be coupled to different ground potentials and thus may enable the monitoring module 334 to prevent unwanted current to flow to the tested component.

Figure 4:
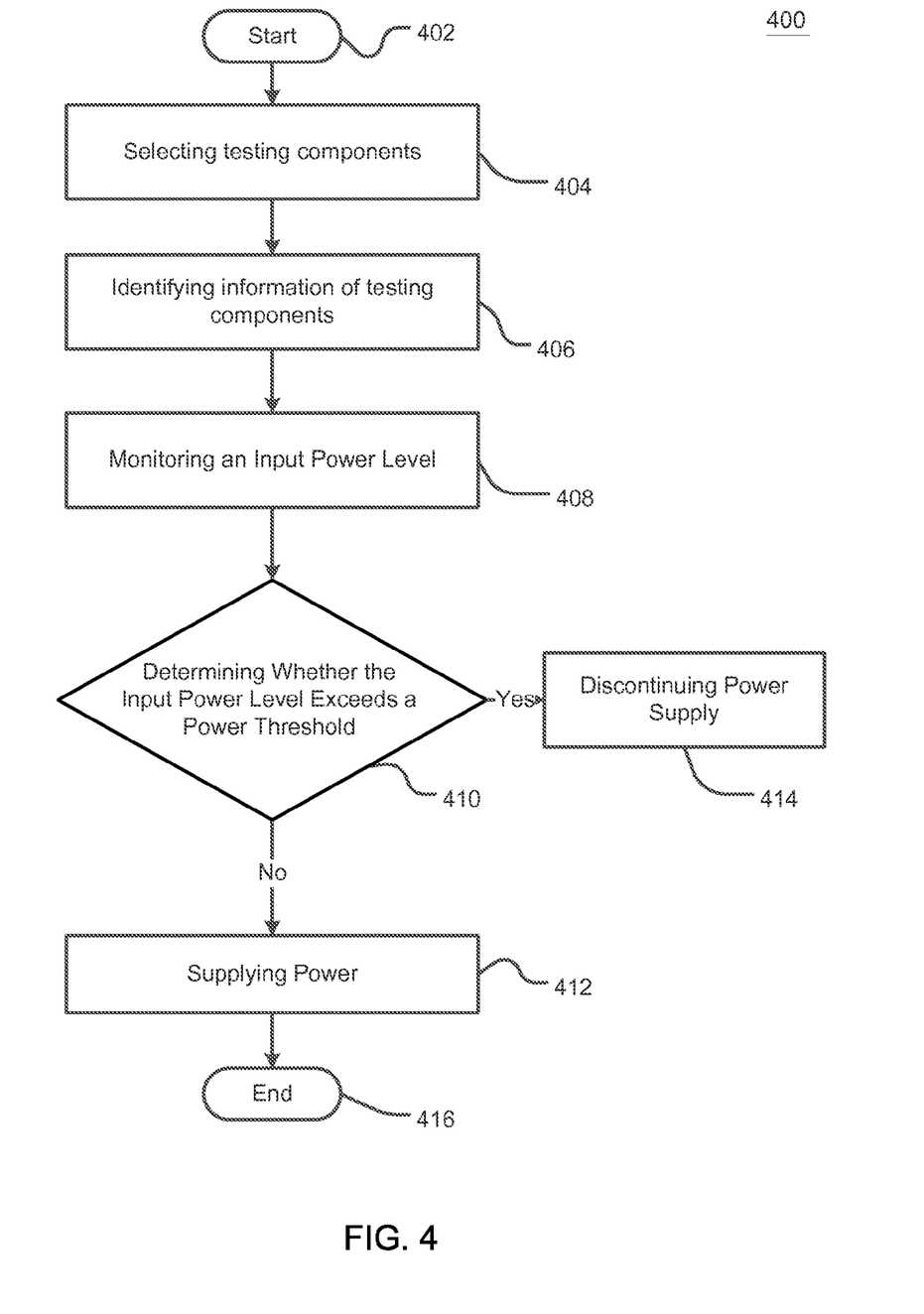
FIG. 4 illustrates a method for monitoring an input power level of an alternator and starter motor tester according to an exemplary embodiment of the present disclosure.

Based on the determination, the monitoring module 334 may continue to couple the power supply to continue the diagnostic test of the components to be tested at step 412, when the input power level does not exceed a threshold power level. Alternatively, the monitoring module 334 may decouple the power supply and discontinue the diagnostic test of the components to be tested at step 414 when the input power level exceeds a threshold power level. At step 416, the method ends. It may be appreciated by one of skilled in the art that the monitoring module 334 may continuously or intermittently monitor the input power level to determine whether the input power level exceeds a predetermined power threshold.

The processor 304 may also interact with a networked computer, LAN (local area network), a smartphone, cellular phone or a distributed network, such as the Internet 322 and the like. This connection allows the user to update the tester 100 and also send information regarding the test results to a remote location. The information sent or received may include software, firmware, language, weather reports and database for the components to be tested or to the tester 100, or results of the component that was tested.

A motor 330 may be provided in order to test alternators. Motor 330 may simulate the engine of a vehicle and include a pulley to mate with a belt. At one end, the belt may be coupled to the motor's 330 pulley and at the other end may be coupled to the pulley of the alternator to be tested.

FIG. 4 illustrates a method 400 for conducting a diagnostic test according to an embodiment of the present disclosure. The method 400 starts at step 402 proceeds to step 404 where the user selects the component or the part to test through an input device, such as the LCD touch screen 302, the bar code or RFID chip. At step, 406, the interface module 324 identifies information associated with the tested components. For example, the interface module 324 may identify a power level (e.g., voltage potential and/or current) at which the tested component should be tested as based on information in the database or from the barcode or RFID chip. At step 408, the monitoring module 334 may monitor an input power level (e.g., input voltage potential and/or input current) of the tester 100. The monitoring module 334 may determine whether to terminate the test based at least in part on the information associated with the tested components at step 410. In exemplary embodiments, the monitoring module 334 may determine whether the input power level is above a power level required to test the component or whether the input power level is above a predetermined threshold. In addition, the monitoring module 334 may determine whether to continue testing the component at a second stage based at least in part on an input power level during a first stage.

Based on the determination, the monitoring module 334 may continue to couple the power supply to continue the diagnostic test of the components to be tested at step 412, when the input power level does not exceed a threshold power level. Alternatively, the monitoring module 334 may decouple the power supply and discontinue the diagnostic test of the components to be tested at step 414 when the input power level exceeds a threshold power level. It may be appreciated by one of skilled in the art that the monitoring module 334 may continuously or intermittently monitor the input power level to determine whether the input power level exceeds a predetermined power threshold.

Figure 5:
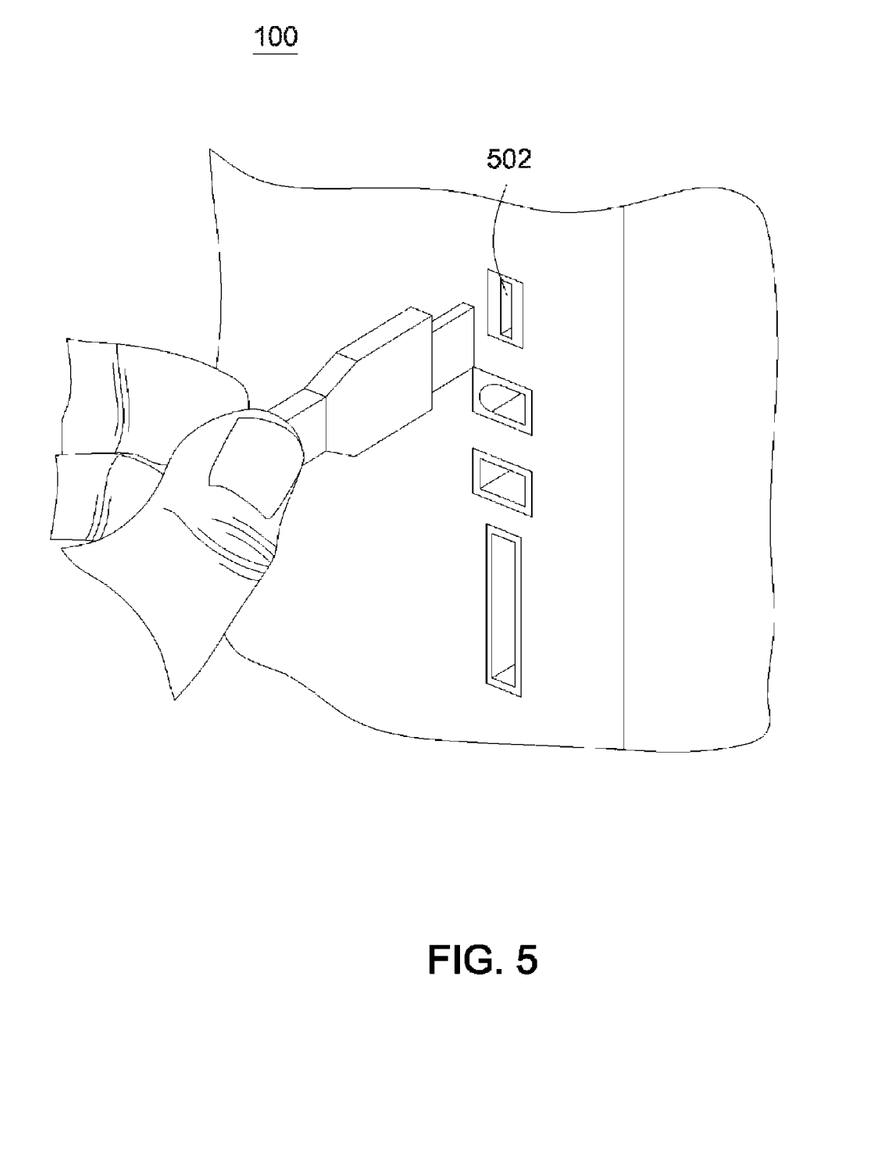
FIG. 5 is a perspective view of the peripheral and remote connections of the alternator and starter motor tester according to an exemplary embodiment of the present disclosure.

Referring to FIG. 5, in some embodiments of the alternator and starter motor tester, network connectivity may be used to track tests based on part number, employee and location in order to improve accuracy of the diagnostic test. The peripheral module ports 502 may be used to communicate to various peripheral devices such as a mouse, a keyboard, or a printer as well as to receive updates and/or downloads from a connected device such as a laptop or person computer. In another exemplary embodiment, the peripheral module ports 502 may be large-scale communication network ports that can be constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The information relayed can include data from the result of an alternator or starter test, the part's warranty information, the part type, the part make and model, previous tests, updates, diagnostic or operating parameters of the alternator and starter tester, maintenance data of the alternator and starter tester, and any other data required by the operator.

Figure 6:
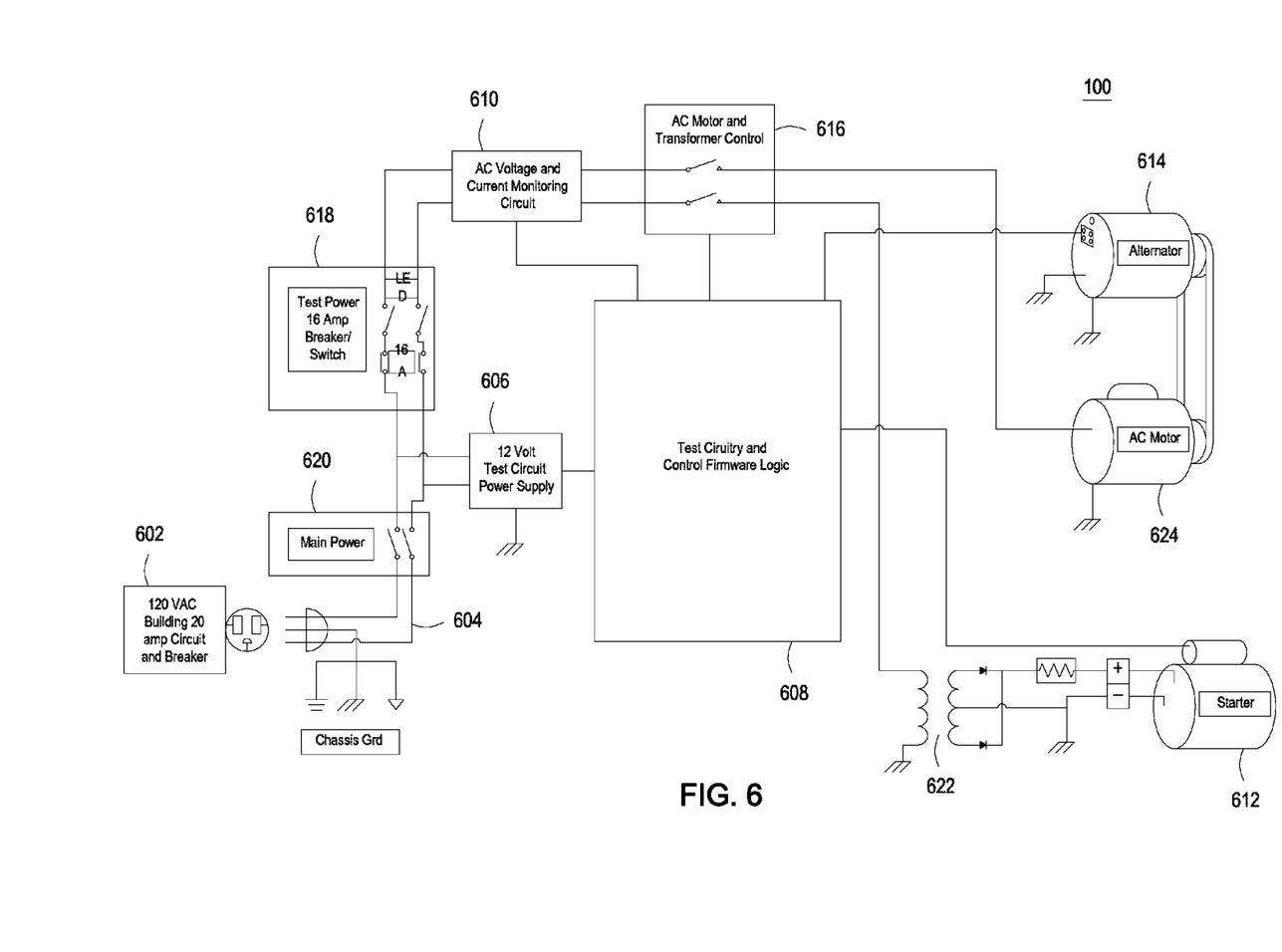
FIG. 6 illustrates a circuit schematic diagram of the alternator and starter motor tester according to an exemplary embodiment of the present disclosure.

FIG. 6 illustrates a circuit schematic diagram of an alternator and starter motor tester 100 according to an embodiment of the present disclosure. The tester 100 may be coupled to an external power source 602 (e.g., an alternating current (AC) power source) via an electrical connection 604. In an exemplary embodiment, the external power source 602 may be a 120V alternating current (AC) and 20 A power source to power an operation of the tester 100. The tester 100 may also include a power switch 620 and a power supply circuitry 606. The power switch 620 may be switched by a user to turn the tester 100 "ON" and "OFF" to perform a diagnostic test of vehicular components. The power supply circuitry 606 may include a transformer circuitry and a rectifier circuitry (not shown) for converting the power received from the external power source 602 into a power that may be used by the tester 100. In an exemplary embodiment, the transformer circuitry of the power supply circuitry 606 may convert the 120V alternating current (AC) power signal to a 12V alternating current (AC) power signal. The rectifier circuitry (not shown) of the power supply circuitry 606 may convert (e.g., rectify) the 12V alternating current (AC) power signal to a 12V direct current (DC) power signal to power the tester 100.

For example, the power supply circuitry 606 may supply power to a test and control circuitry 608 to run a transformer 622 and an alternating current (AC) motor 624 via a drive control circuitry 616. The test and control circuitry 608 may provide one or more control signals to the drive control circuitry 616 to control the a power level supplied to the transformer 622 and the AC motor 624 to perform diagnostic test on the starter motor 612 and the alternator 614, respectively. During the diagnostic test, the monitoring circuitry 610 may monitor an input power level (e.g., input voltage potential and/or input current) to the tester 100. In the event that the input power level exceeds a predetermined threshold, the monitoring circuitry 610 may cutoff the power supply to the AC motor 624 or the transformer 622 via the drive control circuitry 616 to stop the diagnostic test. The breaker/switch circuitry 618 may include a switch that may allow a user to manually turn the switch ON and OFF to cutoff the power supply to stop the diagnostic test. Also, the breaker/switch circuitry 618 may include a breaker that may be tripped when the monitoring circuitry 610 does not detect that the power level exceeds a predetermined threshold.

For example, the monitoring circuitry 610 may monitor the power level (e.g., voltage potential and/or current) at different stages of the diagnostic test. The monitoring circuitry 610 may monitor the power level at different stages of the diagnostic test performed by the tester 100. During any stage of the test, the monitoring circuitry 610 may terminate the test when the input power level exceeds a predetermined threshold by turning off the drive control circuitry 616. In another exemplary embodiment, the monitoring circuitry 610 may monitor a power level at a first stage of the diagnostic test to determine either to continue the diagnostic test to a second stage or terminate the diagnostic test by turning off the drive control circuitry 616. In another exemplary embodiment, the monitoring circuitry 610 may cutoff the power supply during any stage of the diagnostic test when the power level exceeds a predetermined threshold.

The many features and advantages of the present disclosure are apparent from the detailed specification, and thus, it is intended by the appended claims to cover all such features and advantages of the present disclosure, which fall within the true spirit, and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

What is claimed is:

1. A diagnostic tool configured to test a performance of a vehicle component, the diagnostic tool comprising:
    a processor configured to process test information from the vehicle component and control the vehicle component to be tested;
    a memory configured to store the test information of the vehicle component and software that operates the vehicle component;
    a monitoring module configured to monitor a power supply that is provided to perform the testing of the vehicle component, wherein if the monitored power supply exceeds a predetermined threshold, then the monitoring module determines whether to cut off the power supply; and
    an interface module that provides an electrical specification of the vehicle component to the monitoring module that monitors and controls the power supply based at least on the electrical specification, and wherein the memory and the monitoring module are in communication with the processor.

2. The diagnostic tool of claim 1, wherein the vehicle component is a starter motor and the processor is also configured to control the starter motor and process starter motor information.

3. The diagnostic tool of claim 1, wherein the vehicle component is an alternator and the processor is also configured to control the alternator and process alternator information.

4. The diagnostic tool of claim 1, wherein the power supply is a current or voltage supply.

5. The diagnostic tool of claim 1, wherein the monitoring module monitors the power supply continuously or intermittently.

6. The diagnostic tool of claim 1, wherein the monitoring module comprises a galvanic isolated monitoring circuitry.

7. The diagnostic tool of claim 1, further comprising a drive control circuitry configured to cause a cutoff of the power supply provided to perform the testing of the vehicle component, wherein the monitoring module works with the drive control circuitry.

8. The diagnostic tool of claim 1, wherein the monitoring module monitors the power supply of a first stage and a second stage of the testing of the vehicle component.

9. The diagnostic tool of claim 8, wherein the monitoring module determines whether to continue to the second stage of the testing of the vehicle component based at least in part on the power supply of the first stage.

10. The diagnostic tool of claim 9, wherein the predetermined threshold is determined based at least in part on the test information.

11. A method of testing of a vehicle component, comprising the steps of:
   receiving, via an input device, a selection of the vehicle component for testing;
   processing, with a processor, test information from the vehicle component;
   controlling, with the processor, the vehicle component to be tested;
   storing in a memory the test information of the vehicle component and software that operates the vehicle component;
   identifying, via an interface module, electrical specification information associated with the vehicle component including test information about the vehicle component;
   monitoring, via a monitoring module, a power supply provided to perform the testing of the vehicle component based on the electrical specification information;
   determining if the power supply exceeds a predetermined threshold; and
   terminating the power supply if the power supply was determined to exceed the predetermined threshold.

12. The method of claim 11, wherein identifying information associated with the vehicle component comprises identifying a power level at which the vehicle component should be tested at.

13. The method of claim 11, wherein the monitoring of the power supply is continuous.

14. The method of claim 11, wherein the monitoring of the power supply is intermittent.

15. The method of claim 14, further comprising decoupling the power supply provided to perform the testing of the vehicle component when the monitored power supply exceeds the predetermined threshold.

16. The method of claim 11, wherein monitoring of the power supply further comprises monitoring the power supply of a first stage of the testing and the power supply of a second stage of the testing of the vehicle component.

17. The method of claim 16, further comprising determining whether to cutoff the power supply of the second stage based at least in part on the power supply of the first stage of the testing of the vehicle component.

18. A diagnostic tester configured to test a performance of a vehicle component, the tester comprising:
   a processor configured to process test information from the vehicle component and control the vehicle component to be tested;
   a memory configured to store database information of the vehicle component and software that operates the vehicle component;
   a power lead configured to provide a power supply to perform the testing of the vehicle component; and
   a monitoring module configured to monitor the power supply, wherein if the monitored power supply exceeds a predetermined threshold, then the monitoring module determines whether to cut off the power supply using a drive control system in the tester and wherein the memory and the monitoring module are in communication with the processor.

19. The tester of claim 18, wherein the monitoring module monitors the power supply continuously or intermittently.

20. The tester of claim 18, wherein the monitoring module monitors the power supply of a first stage of the testing and the power supply of a second stage of the testing of the vehicle component, the monitoring module cuts off the power supply of the second stage based at least in part on the power supply of the first stage of the testing of the vehicle component.

* * * * *